(12) United States Patent
Ko et al.

(10) Patent No.: US 9,790,586 B2
(45) Date of Patent: Oct. 17, 2017

(54) MASK FRAME ASSEMBLY, METHOD OF MANUFACTURING THE SAME, AND METHOD OF MANUFACTURING ORGANIC LIGHT-EMITTING DISPLAY APPARATUS

(71) Applicant: SAMSUNG DISPLAY CO., LTD., Yongin, Gyeonggi-Do (KR)

(72) Inventors: Junhyeuk Ko, Yongin (KR); Daewon Baek, Yongin (KR); Eunji Lee, Yongin (KR)

(73) Assignee: Samsung Display Co., Ltd., Yongin, Gyeonggi-do (KR)

(*) Notice: Subject to any disclaimer, the term of this patent is extended or adjusted under 35 U.S.C. 154(b) by 89 days.

(21) Appl. No.: 14/710,738

(22) Filed: May 13, 2015

(65) Prior Publication Data

US 2016/0126507 A1   May 5, 2016

(30) Foreign Application Priority Data

Oct. 31, 2014   (KR) .................. 10-2014-0150630

(51) Int. Cl.
| | |
|---|---|
| *H01L 51/00* | (2006.01) |
| *H01L 21/00* | (2006.01) |
| *C23C 14/04* | (2006.01) |
| *H01L 27/32* | (2006.01) |
| *H01L 51/52* | (2006.01) |
| *H01L 51/56* | (2006.01) |

(52) U.S. Cl.
CPC ........ *C23C 14/042* (2013.01); *H01L 27/3244* (2013.01); *H01L 51/0011* (2013.01); *H01L 51/5256* (2013.01); *H01L 51/56* (2013.01)

(58) Field of Classification Search
CPC ........................................ H01L 51/56
USPC ............................... 257/40; 438/34
See application file for complete search history.

(56) References Cited

U.S. PATENT DOCUMENTS

| | | | | |
|---|---|---|---|---|
| 2004/0104197 | A1* | 6/2004 | Shigemura | C23C 14/042 216/20 |
| 2004/0183435 | A1  | 9/2004 | Ohshita | |
| 2008/0018236 | A1* | 1/2008 | Arai | C23C 14/042 313/504 |
| 2013/0298826 | A1* | 11/2013 | Park | B05C 21/005 118/504 |
| 2014/0331925 | A1* | 11/2014 | Han | C23C 14/042 118/504 |

(Continued)

FOREIGN PATENT DOCUMENTS

| | | |
|---|---|---|
| KR | 10-2003-0095580 A | 12/2003 |
| KR | 10-2004-0047556 A | 6/2004 |
| KR | 10-2004-0082959 A | 9/2004 |

(Continued)

*Primary Examiner* — Igwe U Anya
(74) *Attorney, Agent, or Firm* — Lee & Morse, P.C.

(57) ABSTRACT

A mask frame assembly includes a frame, and a mask tensioned on the frame in a first direction, the mask having a deposition pattern portion having a plurality of pattern holes therethrough, a deposition material being deposited on a substrate through the pattern holes, and a dummy portion extending from the deposition pattern portion in the first direction, the dummy portion having an increased thickness in a second direction as a distance from the deposition pattern portion in the first direction increases, the second direction being oriented along a normal to the mask.

17 Claims, 5 Drawing Sheets

(56) References Cited

U.S. PATENT DOCUMENTS

2015/0007768 A1\* 1/2015 Lee .................. H01L 51/56
 118/504
2015/0322562 A1\* 11/2015 Pan .................. C23C 14/042
 427/272

FOREIGN PATENT DOCUMENTS

KR 10-2007-0090018 A 9/2007
KR 10-2012-0022135 A 3/2012

\* cited by examiner

MASK FRAME ASSEMBLY, METHOD OF MANUFACTURING THE SAME, AND METHOD OF MANUFACTURING ORGANIC LIGHT-EMITTING DISPLAY APPARATUS

CROSS-REFERENCE TO RELATED APPLICATION

Korean Patent Application No. 10-2014-0150630, filed on Oct. 31, 2014, in the Korean Intellectual Property Office, and entitled: "Mask Frame Assembly, Method Of Manufacturing The Same, and Method Of Manufacturing Organic Light-Emitting Display Apparatus," is incorporated by reference herein in its entirety.

BACKGROUND

1. Field

One or more exemplary embodiments relate to mask frame assemblies, methods of manufacturing the same, and methods of manufacturing organic light-emitting display apparatuses.

2. Description of the Related Art

In general, an organic light-emitting display apparatus, which is one of the flat panel display apparatuses, is a self-luminous display apparatus. The organic light-emitting display apparatus may be driven at a low voltage while having a wide viewing angle and a high contrast. In addition, the organic light-emitting display apparatus has a fast response time while having a light weight and a slim profile. Therefore, the organic light-emitting display apparatus is considered as a next-generation display apparatus.

Light-emitting devices are classified into inorganic light-emitting devices and organic light-emitting devices according to materials forming an emission layer. Recently, organic light-emitting devices have been actively developed, since organic light-emitting devices have higher luminance and faster response time than inorganic light-emitting devices, and may provide color display.

SUMMARY

According to one or more exemplary embodiments, a mask frame assembly includes a frame; and a mask installed on the frame while being tensioned in a first direction, the mask including: a deposition pattern portion having a plurality of pattern holes through which a deposition material is deposited on a substrate; and a dummy portion extending from the deposition pattern portion in the first direction and having a thickness increasing away from the deposition pattern portion in the first direction.

The dummy portion may include a plurality of step portions formed from the deposition pattern portion in the first direction.

Lengths of the plurality of step portions in the first direction may decrease away from the deposition pattern portion in the first direction.

Heights of the plurality of step portions may decrease away from the deposition pattern portion in the first direction.

The dummy portion may include a slope portion formed between the deposition pattern portion and the step portion.

The dummy portion may include a plurality of curved portions formed concavely from the deposition pattern portion in the first direction.

Curvature radiuses of the plurality of curved portions may decrease away from the deposition pattern portion in the first direction.

The dummy portion may include a slope portion formed between the deposition pattern portion and the curved portion.

The dummy portion may include a dummy pattern formed of at least one of a hole, a slit, and a groove at one surface of the mask.

According to one or more exemplary embodiments, a method of manufacturing a mask frame assembly, the method including preparing a frame, preparing a mask, the mask including a deposition pattern portion having a plurality of pattern holes therethrough, a deposition material being deposited on a substrate through the pattern holes, and a dummy portion extending from the deposition pattern portion in the first direction, the dummy portion having an increased thickness in a second direction as a distance from the deposition pattern portion in the first direction increases, and installing the mask on the frame while tensioning both ends of the mask in the first direction.

In the preparing of the mask, a laser may be irradiated onto the dummy portion to form a plurality of step portions in the first direction.

In the preparing of the mask, the plurality of step portions may be formed such that lengths of the plurality of step portions in the first direction decrease away from the deposition pattern portion in the first direction.

In the preparing of the mask, the plurality of step portions may be formed such that heights of the plurality of step portions decrease away from the deposition pattern portion in the first direction.

In the preparing of the mask, a plurality of curved portions may be formed at the dummy portion in the first direction by an etching process.

In the preparing of the mask, the plurality of curved portions may be formed such that curvature radiuses of the plurality of curved portions decrease away from the deposition pattern portion in the first direction.

In the preparing of the mask, a dummy pattern formed of at least one of a hole, a slit, and a groove may be formed at one surface of the dummy portion.

According to one or more exemplary embodiments, there is provided a method of manufacturing an organic light-emitting display apparatus includes forming a first electrode and a second electrode that are opposite to each other on a substrate, forming an organic layer between the first electrode and the second electrode, wherein the organic layer or the second electrode is deposited by using a mask frame assembly including a frame, and a mask tensioned on the frame in a first direction, the mask including a deposition pattern portion having a plurality of pattern holes therethrough, a deposition material being deposited on a substrate through the pattern holes, and a dummy portion extending from the deposition pattern portion in the first direction, the dummy portion having an increased thickness in a second direction as a distance from the deposition pattern portion in the first direction increases.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when an element is referred to as being "on" another element or substrate it can be directly on the other element or substrate, or intervening elements may also be present. In addition, it will also be understood that when an element is referred to as being "between" two elements, it can be the only element between the two elements, or one or more intervening elements may also be present.

As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first", "second", etc. may be used herein to describe various components, these components should not be limited by these terms. These terms are only used to distinguish one component from another. As used herein, the singular forms "a", "an", and "the" are intended to include the plural forms as well, unless the context clearly indicates otherwise. It will be further understood that the terms "comprise", "include", and "have" used herein specify the presence of stated features or components, but do not preclude the presence or addition of one or more other features or components.

When a certain embodiment may be implemented differently, a specific process order may be performed differently from the described order. For example, two consecutively described processes may be performed substantially at the same time or performed in an order opposite to the described order.

In the following examples the x-axis, the y-axis, and the z-axis are not limited to the three axes of the rectangular coordinate system. and may be interpreted in a broader sense. For example, the x-axis, the y-axis, and the z-axis may be perpendicular to one another, or may represent different directions that are not perpendicular to one another.

Hereinafter, exemplary embodiments will be described in detail with reference to the accompanying drawings. In the following description, like reference numerals denote like elements, and redundant descriptions thereof will be omitted.

Figure 1:
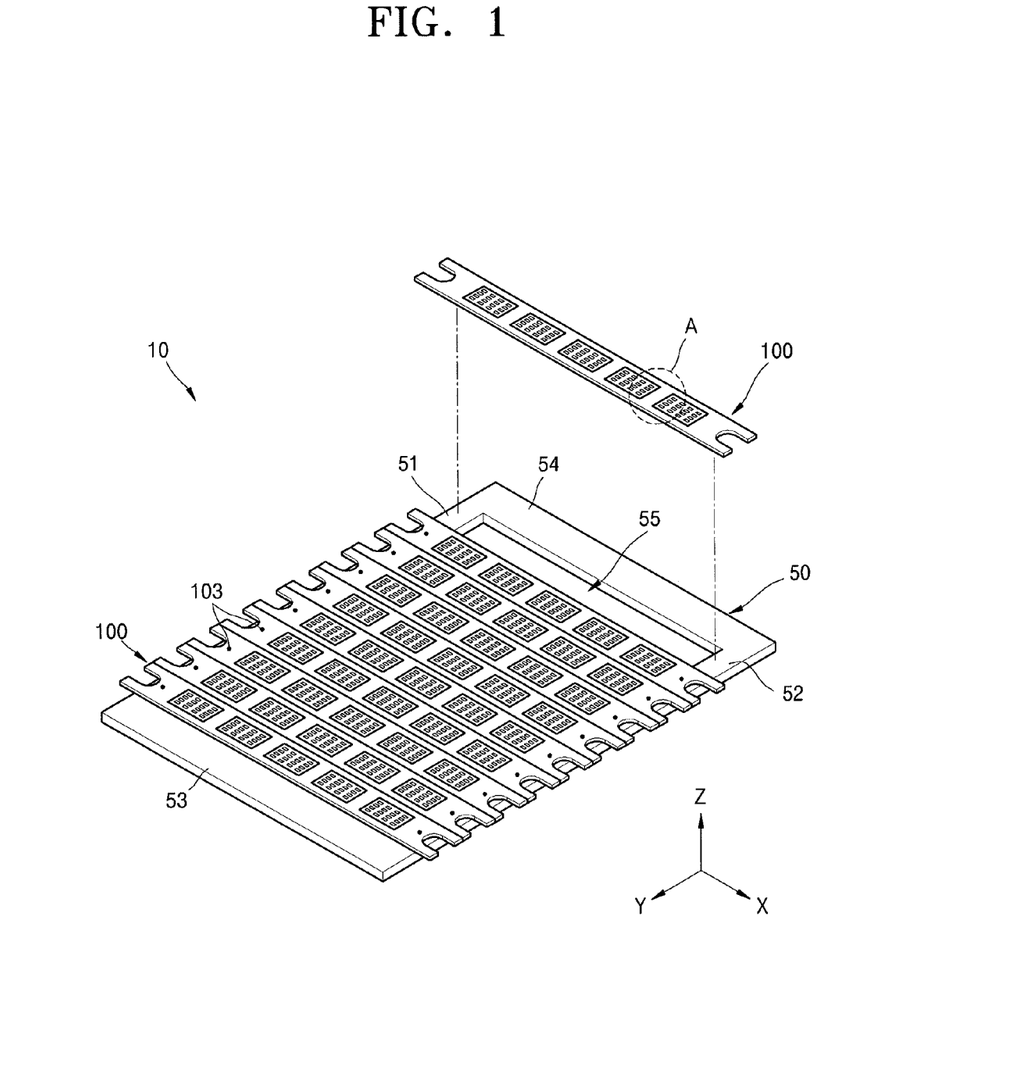
FIG. 1 illustrates an exploded perspective view of a mask frame assembly according to an exemplary embodiment.
Figure 2:
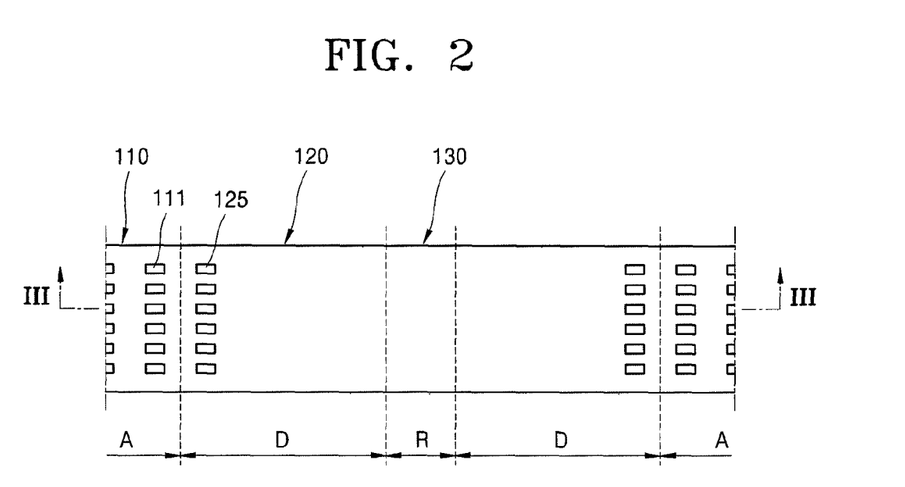
FIG. 2 illustrates an enlarged plan view of portion A of FIG. 1.
Figure 3A:
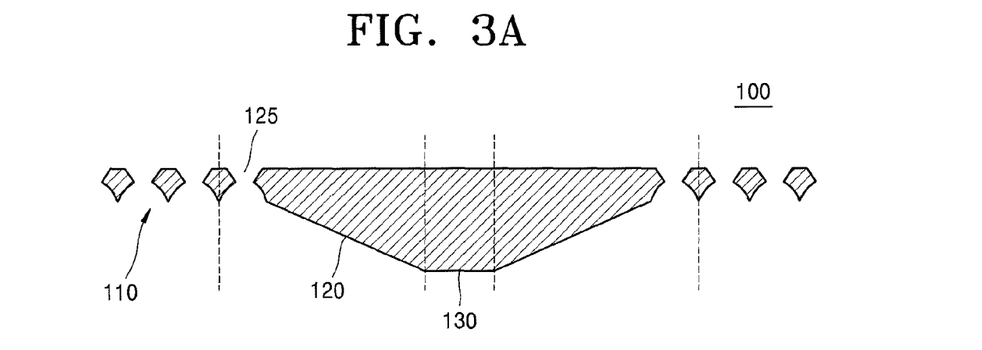
FIG. 3A illustrates a cross-sectional view taken along line III-III of FIG. 2.

FIG. 1 illustrates an exploded perspective view of a mask frame assembly 10 according to an exemplary embodiment. FIG. 2 illustrates an enlarged plan view of portion A of FIG. 1, and FIG. 3A illustrates a cross-sectional view along line of FIG. 2.

Referring to FIGS. 1 to 3A, the mask frame assembly 10 may include a frame 50 and a mask 100. The mask 100 may include a deposition pattern portion 110 with a plurality of pattern holes 111.

The frame 50 may be coupled with the mask 100 to support the mask 100. The frame 50 may include an opening portion 55 through which a deposition material may pass, and a plurality of support portions formed outside the opening portion 55. For example, as illustrated in FIG. 1, the plurality of support portions may be joined to define the frame 50 and to surround the opening portion 55. The frame 50 may be formed of metal or synthetic resin, and may be formed to have one or more opening portions 55 having a tetragonal shape. However, exemplary embodiments are not limited thereto, and the frame 50 may be formed to have various shapes, e.g., a circular shape and a hexagonal shape.

The plurality of support portions may include a first support portion 51 and a second support portion 52 that face each other in an X direction, and are disposed in parallel to each other in a Y direction. The plurality of support portions may further include a third support portion 53 and a fourth support portion 54 that face each other in the Y direction, and are disposed in parallel to each other in the X direction. The first support portion 51, the second support portion 52, the third support portion 53, and the fourth support portion 54 may be connected together into a tetragonal frame.

The frame 50 may be formed of a metal having high rigidity. The mask 100 may be fixed to the frame 50 by a welding process. Since high-temperature heat is generated around a weld portion 103 during the welding process, the frame 50 may be formed of a material having low thermal deformation.

The mask 100 may include the deposition pattern portion 110 having the plurality of pattern holes 111, a dummy portion 120 formed outside the deposition pattern portion 110, and a rib portion 130 connecting the dummy portion 120.

The deposition pattern portion 110 may be disposed in correspondence to, e.g., over, the opening portion 55 of the frame 50, so that a deposition material that passed through the opening portion 55 may be deposited on a substrate through the pattern holes 111 in the deposition pattern portion 110. That is, the deposition pattern portion 110 may define a deposition region on the substrate when the deposition material is deposited on the substrate through the mask 100.

The pattern holes 111 are illustrated as including a plurality of dot-type masking patterns. However exemplary embodiments are not limited thereto. e.g., the pattern holes 111 may include a masking pattern maintaining an entirely open state or may include a dot-type masking pattern. The number, position, and shape of the pattern holes 111 and the deposition pattern portion 110 illustrated in FIG. 1 are merely exemplary, and exemplary embodiments are not limited thereto. For example, the mask 100 may be formed as one large, e.g., and continuous, member to be coupled with the frame 50. In another example, for distribution of the weight of the mask 100, the mask 100 may be formed of a plurality of stick-type masks (as illustrated in FIG. 1).

The deposition pattern portion 110 may be formed by etching or laser patterning. The deposition pattern portion 110 may be formed by melting a raw material or etching a portion of the raw material by the above-described process. In this case, the deposition pattern portion 110 may be formed to have a smaller thickness than the rib portion 130 that is a non-deposition region.

The dummy portion 120 may be formed outside the deposition pattern portion 110 to connect the deposition pattern portion 110 and the rib portion 130. The dummy portion 120 may be formed in a first direction that is the lengthwise direction of the mask 100, e.g., along the x-axis in FIG. 1.

In detail, the mask 100 may be tensile-welded to the frame 50 to minimize deformation of the mask 100 due to stress concentration during fixing of the mask 100 to the frame 50. For tensile-welding of the mask 100, both ends of the mask 100 are clamped, and then the mask 100 is tensioned, e.g., stretched, in the first direction. Thereafter the tensioned. e.g., stretched, mask 100 is aligned with the frame 50, followed by welding of the tensioned mask 100 to the frame 50. Since the mask 100 is tensioned in the first direction, the mask 100 may be deformed by stress concentration in the first direction. In order to minimize the deformation of the mask 100, the dummy portion 120 may be formed outside the deposition pattern portion 110 in the first direction.

The dummy portion 120 may be formed such that its thickness increases away from the deposition pattern portion 110 in the first direction. That is, as illustrated in FIG. 3A, the thickness of the dummy portion in the vertical direction, e.g., along the z-axis, increases, as a distance from the deposition pattern portion 110 in the first direction, e.g., along the x-axis, increases.

In detail, the dummy portion 120 may be formed such that its thickness increases from the deposition pattern portion 110 toward the rib portion 130. That is, the dummy portion 120 may be formed such that its thickness changes gradually. The deposition pattern portion 110 may be formed by etching the raw material, and thus may be thinner than the rib portion 130 along the vertical direction. As a sudden thickness change from the deposition pattern portion 110 to the rib portion 130 may change the directionality of some deposition materials to form an attractive force or a repulsive force between the deposition materials, the position of the dummy portion 120 between the deposition pattern portion 110 and the rib portion 130 minimizes the thickness change from the thin deposition pattern portion 110 to the thick rib portion 13, thereby improving deposition accuracy.

The dummy portion 120 may include a first dummy pattern 125 penetrating the mask 100. The first dummy pattern 125 may be formed at both ends of the deposition pattern portion 110, and may be formed to be substantially identical to the pattern holes 111. When the deformation of the pattern holes 111 of the deposition pattern portion 110 is minimized, the deposition material may be accurately deposited on the substrate. However, a boundary region of the deposition pattern portion 110 may be deformed by the tension of the mask 100, and deposition may not be accurately performed due to the thickness difference between the deposition pattern portion 110 and the dummy portion 120. Thus, the deposition material may be accurately deposited on the substrate by forming the first dummy pattern 125 at end portions of the deposition pattern portion 110 in the first direction and minimizing the height difference between the first dummy pattern 125 and the deposition pattern portion 110. Also, the deformation of the deposition pattern portion 110 may be minimized, since only the first dummy pattern 125 is deformed when the mask 100 is tensioned.

The rib portion 130 may connect adjacent dummy portions 120 to support the mask 100. The rib portion 130 may support the deposition pattern portion 110 to prevent the mask 100 from sagging from the frame 50. The rib portion 130 may be supported by a supporter (not illustrated) connected to each of the support portions of the frame 50, to effectively distribute the weight of the mask 100.

The deposition material may be discharged from a deposition source, and then deposited on the substrate through the mask frame assembly 10. Since the mask 100 is formed by etching or melting a portion of the raw material, the deposition pattern portion 110 may be thinner than the rib portion 130. When a sudden thickness difference is formed between the deposition pattern portion 110 and the rib portion 130, a non-uniform deposition may be generated by the sudden thickness difference. When the deposition material collides against a step portion formed by the deposition pattern portion 110 and the rib portion 130, the deposition material may lose its directionality and thus may be non-uniformly deposited on the substrate.

The dummy portion 120 may be formed such that its thickness increases gradually from the deposition pattern portion 110 toward the rib portion 130. Since the step portion formed by the deposition pattern portion 110 and the rib portion 130 is not formed at an adjacent portion of the deposition pattern portion 110, the deposition material may be deposited in a direction perpendicular to the substrate. The dummy portion 120 may minimize a shadow effect of the deposition pattern portion 110 to improve the deposition accuracy.

The dummy portion 120 may minimize the deformation of the deposition pattern portion 110, since a stress is concentrated on the dummy portion 120 when the mask 100 is installed on the frame 50. The deformation of the deposition pattern portion 110 may be reduced, since only the first dummy pattern 125 is deformed when the mask 100 is tensioned. Also, since the dummy portion 120 is formed to be thin on the deposition pattern portion 110, a stress may be concentrated on the dummy portion 120 when the mask 100 is tensioned in the first direction. When the mask 100 is tensioned, a deformation may be easily generated in a thinner region. Since the dummy portion 120 is formed to be thin in a region adjacent to the deposition pattern portion 110, a tensile deformation may be generated only at the dummy portion 120 to minimize the deformation of the deposition pattern portion 110.

Figure 3B:
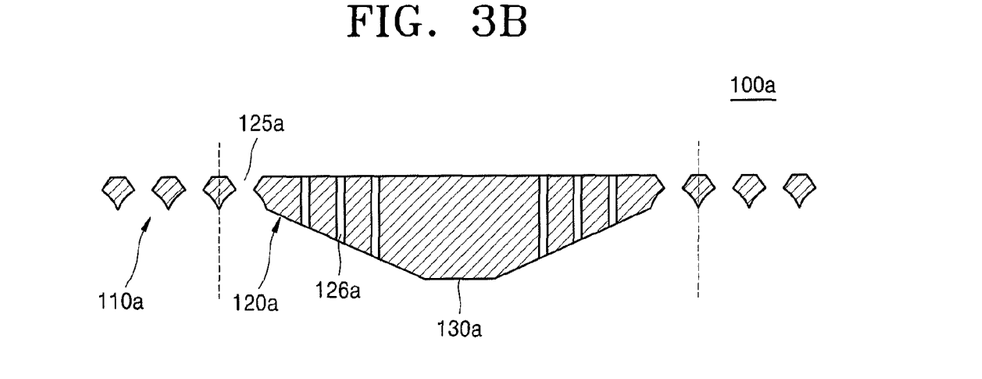
FIG. 3B illustrates a cross-sectional view of a mask according to a modification of an exemplary embodiment.

FIG. 3B illustrates a cross-sectional view of a mask 100a according to a modification of an exemplary embodiment.

Referring to FIG. 3B, the mask 100a may include a deposition pattern portion 110a, a dummy portion 120a, and a rib portion 130a. Since the deposition pattern portion 110a and the rib portion 130a are identical or similar to those of the mask 100 according to the above exemplary embodiment, detailed descriptions thereof will be omitted.

The dummy portion 120a may be formed such that its thickness increases away from the deposition pattern portion 110a in the first direction. The dummy portion 120a may be formed such that its thickness increases from the deposition pattern portion 110a toward the rib portion 130a. The dummy portion 120a may include a first dummy pattern 125a and a second dummy pattern 126a. Since the first dummy pattern 125a is identical to the first dummy pattern 125 according to the above exemplary embodiment, detailed descriptions thereof will be omitted.

The second dummy pattern 126a may be formed at one surface of the dummy portion 120a. The second dummy pattern 126a may be formed as at least one of a hole, a slit, and a groove. The second dummy pattern 126a may minimize the deformation of the deposition pattern portion 110a, since only the second dummy pattern 126a is deformed when the mask 100a is tensioned in the first direction.

Figure 4A:
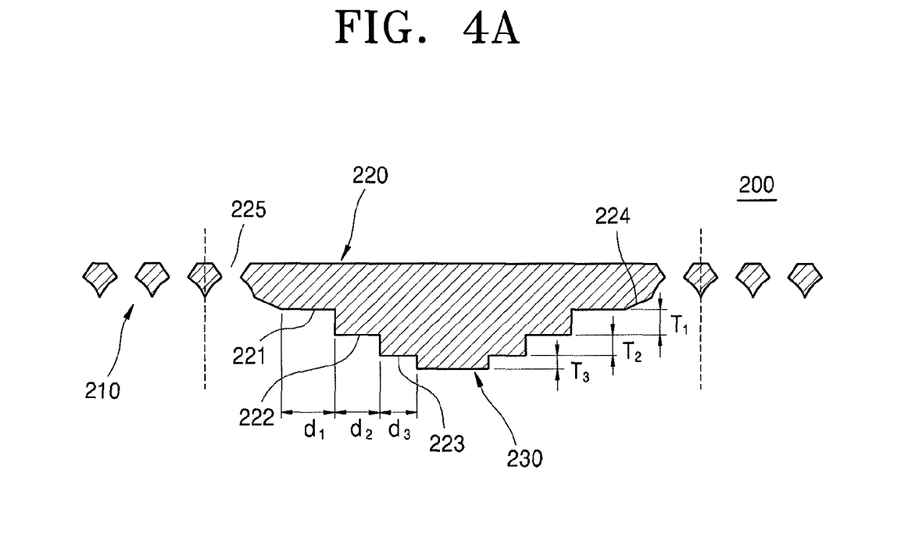
FIG. 4A illustrates a cross-sectional view of a mask according to another exemplary embodiment.
Figure 4B:
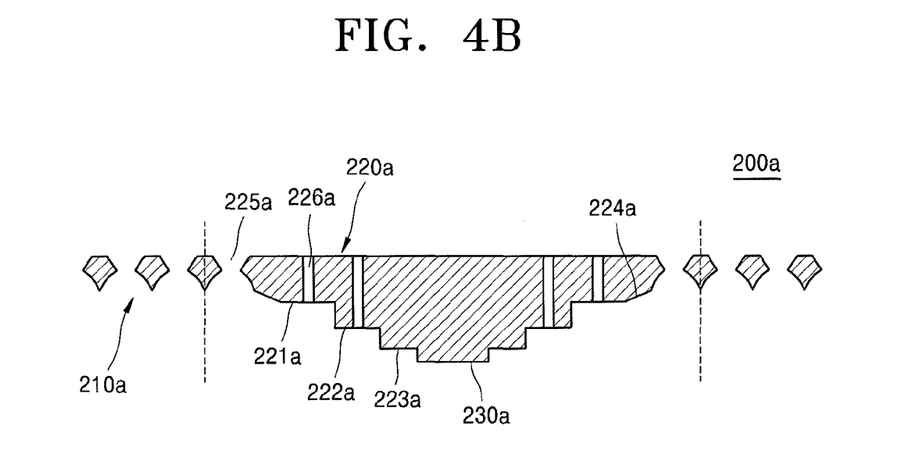
FIG. 4B illustrates a cross-sectional view of a mask according to a modification of another exemplary embodiment.

FIG. 4A illustrates a cross-sectional view of a mask 200 according to another exemplary embodiment. FIG. 4B is a cross-sectional view of a mask 200a according to a modification of another exemplary embodiment.

Referring to FIG. 4A, the mask 200 may include a deposition pattern portion 210, a dummy portion 220, and a rib portion 230. Since the deposition pattern portion 210 and the rib portion 230 are identical or similar to those of the mask 100 according to the above exemplary embodiment, detailed descriptions thereof will be omitted.

The dummy portion 220 may be formed such that its thickness increases away from the deposition pattern portion 210 in the first direction. The dummy portion 220 may be formed such that its thickness increases from the deposition pattern portion 210 toward the rib portion 230. The dummy portion 220 may be formed to be stepped from the deposition pattern portion 210 in the first direction. The dummy portion 220 may include a plurality of step portions in the first direction. The dummy portion 220 may include any number of step portions. However, for convenience of description, the following description will focus on the case where the dummy portion 220 includes three step portions. The dummy portion 220 may include a first step portion 221, a second step portion 222, and a third step portion 223. The step portions may be formed by laser patterning.

The lengths of the step portions in the first direction may decrease away from the deposition pattern portion 210 in the first direction. The lengths of the step portions may decrease from the deposition pattern portion 210 toward the rib portion 230. The first step portion 221 may have a length of dl, the second step portion 222 may have a length of d2, and the third step portion 223 may have a length of d3. In this case the first step portion 221 may have the greatest length d1, and the third step portion 223 may have the smallest length d3. That is, the lengths of the first, second, and third step portions 221, 222, and 223 may be of d1>d2>d3. Since the first step portion 221 adjacent to the deposition pattern portion 210 is formed to have the greatest length, a section having a small thickness difference between the deposition pattern portion 210 and the dummy portion 220 may be secured. When the thickness difference between the first step portion 221 and the deposition pattern portion 210 is minimized, the non-uniformity of deposition caused by the height difference may be minimized and thus the deposition material may be accurately deposited on the substrate.

The heights of the step portions may decrease away from the deposition pattern portion 210 in the first direction. The first step portion 221 may have a height of T1, the second step portion 222 may have a height of T2, and the third step portion 223 may have a height of T3. In this case, the first step portion 221 may have the greatest height T1, and the third step portion 223 may have the smallest height T3. That is, the heights of the first, second, and third step portions 221, 222, and 223 may be of T1>T2>T3. The rib portion 230 has to maintain a certain degree of thickness in order to maintain the rigidity of the mask 200, and the thickness of the deposition pattern portion 210 has to be minimized in order to minimize a shadow effect generated in a deposition process. When the first step portion 221 is formed to have the greatest height, the thickness difference between the deposition pattern portion 210 and the first step portion 221 may be minimized and thus the deposition material may be accurately deposited on the substrate. Also, since the heights of the second and third step portions 222 and 223 decrease away from the first step portion 221 in the first direction, the rigidity of the mask 200 may be maintained.

The dummy portion 220 may include a slope portion 224 formed between the deposition pattern portion 210 and the first step portion 221. The slope portion 224 may be formed to be connected to the deposition pattern portion 210 and also to a first dummy pattern 225. The slope portion 224 may form a slope on a step portion formed by the thickness difference between the first step portion 221 and the deposition pattern portion 210 such that the thickness thereof may increase or decrease gradually. The slope portion 224 may prevent the deposition accuracy from decreasing because the deposition material loses its directionality due to the step portion in the deposition process. That is, since the thickness increases gradually from the deposition pattern portion 210 to the first step portion 221, the deposition material may be accurately deposited on the substrate.

Referring to FIG. 4B, the mask 200a may include a deposition pattern portion 210a, a dummy portion 220a, and a rib portion 230a. Since the deposition pattern portion 210a and the rib portion 230a are identical or similar to those of the mask 200 according to the above exemplary embodiment, detailed descriptions thereof will be omitted.

The dummy portion 220a may be formed such that its thickness increases away from the deposition pattern portion 210a in the first direction. The dummy portion 220a may be formed such that its thickness increases from the deposition pattern portion 210a toward the rib portion 230a. The dummy portion 220a may be formed to be stepped from the deposition pattern portion 210a in the first direction. The dummy portion 220a may include a first dummy pattern 225a and a second dummy pattern 226a. Since the first dummy pattern 225a is identical to the first dummy pattern 125 according to the above exemplary embodiment, detailed descriptions thereof will be omitted.

The second dummy pattern 226a may be formed at one surface of the dummy portion 220a. The second dummy pattern 226a may be formed as at least one of a hole, a slit, and a groove. The second dummy pattern 226a may minimize the deformation of the deposition pattern portion 210a, since only the second dummy pattern 226a is deformed when the mask 200a is tensioned in the first direction.

Figure 5A:
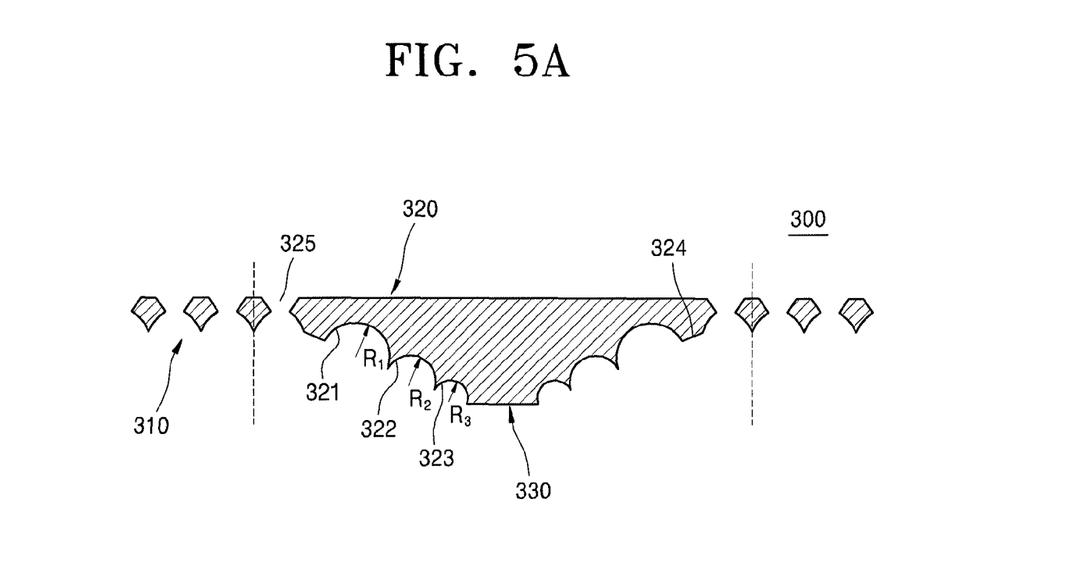
FIG. 5A illustrates a cross-sectional view of a mask according to another exemplary embodiment.
Figure 5B:
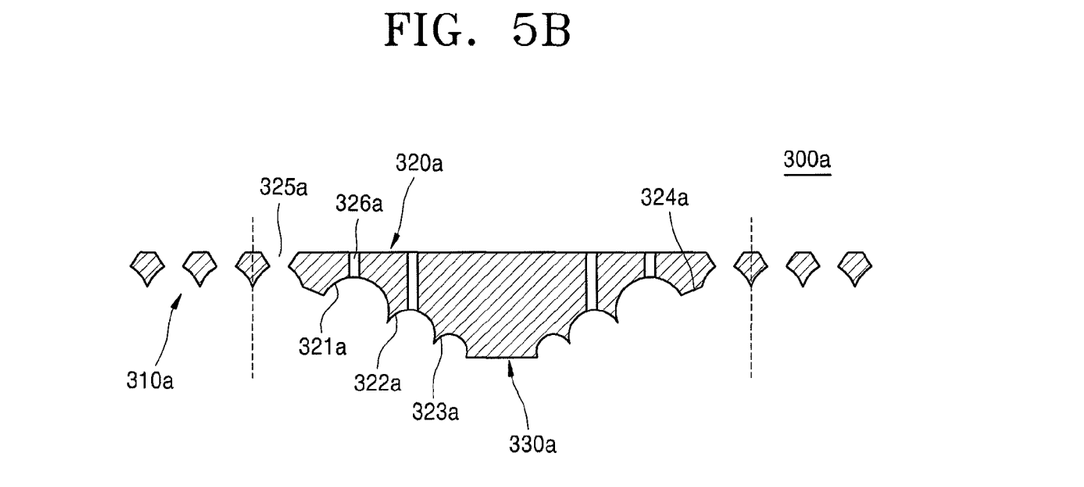
FIG. 5B illustrates a cross-sectional view of a mask according to a modification of another exemplary embodiment.

FIG. 5A illustrates a cross-sectional view of a mask 300 according to another exemplary embodiment. FIG. 5B is a cross-sectional view of a mask 300a according to a modification of another exemplary embodiment.

Referring to FIG. 5A, the mask 300 may include a deposition pattern portion 310, a dummy portion 320, and a rib portion 330. Since the deposition pattern portion 310 and the rib portion 330 are identical or similar to those of the mask 100 according to the above exemplary embodiment, detailed descriptions thereof will be omitted.

The dummy portion 320 may be formed such that its thickness increases away from the deposition pattern portion 310 in the first direction. The dummy portion 320 may be formed such that its thickness increases from the deposition pattern portion 310 toward the rib portion 330. The dummy portion 320 may include curved portions that are formed concavely from the deposition pattern portion 310 in the first direction. The dummy portion 320 may include any number of curved portions. However, for convenience of description, the following description will focus on the case where the dummy portion 320 includes three curved portions. The dummy portion 320 may include a first curved portion 321, a second curved portion 322, and a third curved portion 323. Also, the curved portions may be formed by etching.

The curved portions may have their respective curvature radii, and the curvature radii of the curved portions may decrease away from the deposition pattern portion 310 in the first direction. The first curved portion 321 may have a curvature radius of R1, the second curved portion 322 may have a curvature radius of R2, and the third curved portion 323 may have a curvature radius of R3. In this case, the first curved portion 321 may have the greatest curvature radius R1, and the third curved portion 323 may have the smallest curvature radius R3. That is, the curvature radii of the first, second, and third curved portions 321, 322, and 323 may be of R1>R2>R3. Since the first curved portion 321 adjacent to the deposition pattern portion 310 is formed to have the greatest curvature radius, the thickness difference between the deposition pattern portion 310 and the dummy portion 320 may be minimized. When the thickness difference between the first curved portion 321 and the deposition pattern portion 310 is minimized, the non-uniformity of deposition caused by the height difference may be minimized and thus the deposition material may be accurately deposited on the substrate.

The dummy portion 320 may include a slope portion 324 formed between the deposition pattern portion 310 and the first curved portion 321. The slope portion 324 may be formed to be connected to the deposition pattern portion 310 and also to a first dummy pattern 325. The slope portion 324 may form a slope on a step portion formed by the thickness difference between the first curved portion 321 and the deposition pattern portion 310 such that the thickness thereof may increase or decrease gradually. The slope portion 324 may prevent the deposition accuracy from decreasing because the deposition material loses its directionality due to the step portion in the deposition process. That is, since the thickness increases gradually from the deposition pattern portion 310 to the first curved portion 321, the deposition material may be accurately deposited on the substrate.

Referring to FIG. 5B, the mask 300a may include a deposition pattern portion 310a, a dummy portion 320a, and a rib portion 330a. Since the deposition pattern portion 310a and the rib portion 330a are identical or similar to those of the mask 300 according to the above exemplary embodiment, detailed descriptions thereof will be omitted.

The dummy portion 320a may be formed such that its thickness increases away from the deposition pattern portion 310a in the first direction. The dummy portion 320a may be formed such that its thickness increases from the deposition pattern portion 310a toward the rib portion 330a. The dummy portion 320a may include curved portions that are formed concavely from the deposition pattern portion 310a in the first direction. The dummy portion 320a may include a first dummy pattern 325a and a second dummy pattern 326a. Since the first dummy pattern 325a is identical to the first dummy pattern 125 according to the above exemplary embodiment, detailed descriptions thereof will be omitted.

The second dummy pattern 326a may be formed at one surface of the dummy portion 320a. The second dummy pattern 326a may be formed as at least one of a hole, a slit, and a groove. The second dummy pattern 326a may minimize the deformation of the deposition pattern portion 310a, since only the second dummy pattern 326a is deformed when the mask 300a is tensioned in the first direction.

A method of manufacturing the mask frame assembly 10 may include an operation of preparing a frame, an operation of preparing a mask, and an operation of installing the mask on the frame. Since the dummy portion 320a of the mask 300a is formed to have a thickness increasing away from the deposition pattern portion 310a, the deformation of the deposition pattern portion 310a may be minimized when the mask 300a is installed on the frame 50 while being tensioned in the first direction.

Figure 6:
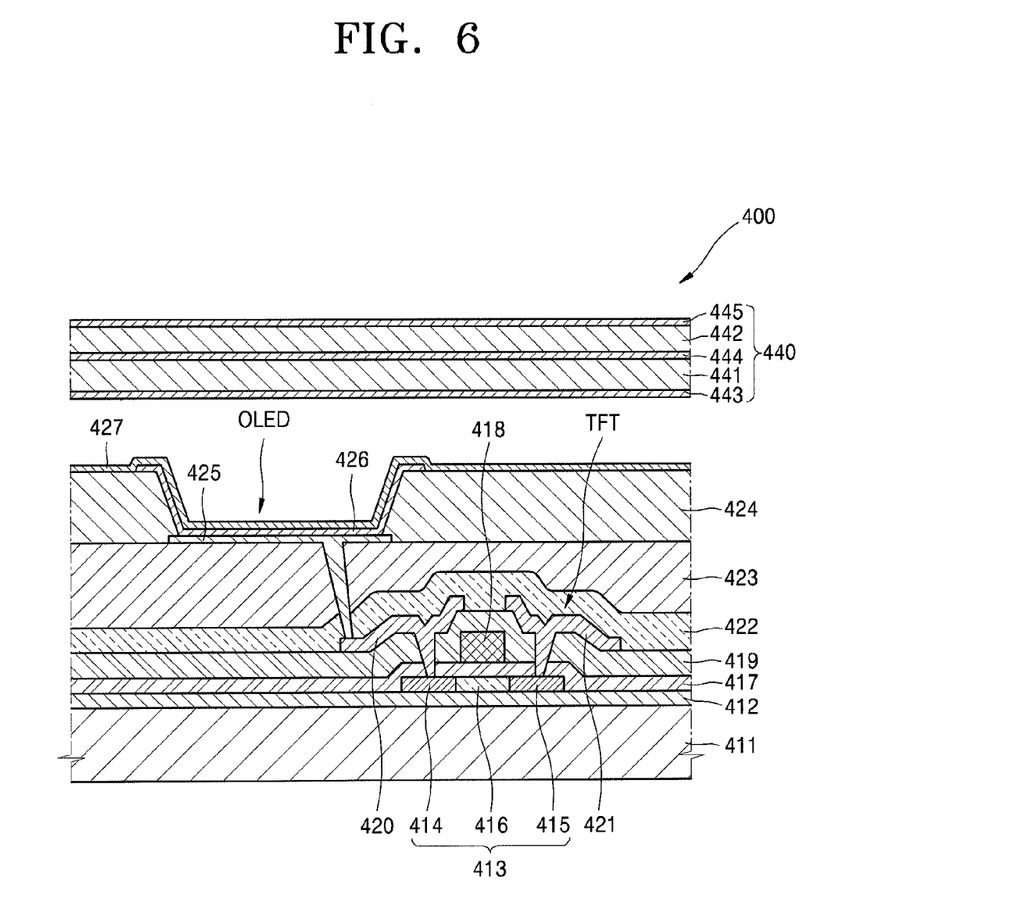
FIG. 6 illustrates a cross-sectional view of an organic light-emitting display apparatus manufactured by using the mask frame assembly illustrated in FIG. 1.

FIG. 6 illustrates a cross-sectional view of an organic light-emitting display apparatus 400 manufactured by using the mask frame assembly 10 illustrated in FIG. 1.

Referring to FIG. 6, a substrate 411 may be provided in the organic light-emitting display apparatus 400. The substrate 411 may include a flexible insulating material. For example, the substrate 411 may be a glass substrate. In another example, the substrate 411 may be formed of a polymer material, e.g., polyimide (PI), polycarbonate (PC), polyethersulphone (PES), polyethylene terephthalate (PET), polyethylene naphthalate (PEN), polyarylate (PAR), or fiber glass reinforced plastic (FRP). The substrate 411 may be transparent, semitransparent, or opaque.

A barrier layer 412 may be formed on the substrate 411. The barrier layer 412 may be formed to cover the entirety of a top surface of the substrate 411. The barrier layer 412 may include an inorganic layer or an organic layer. The barrier layer 412 may be formed of a single layer or a stack of multiple layers. For example, the barrier layer 412 may be formed of at least one selected from inorganic materials. e.g., silicon oxide ($SiO_x$), silicon nitride ($SiN_x$), silicon oxynitride (SiON), aluminum oxide (AIO), and aluminum oxynitride (AlON), or organic materials, e.g., acryl, polyimide, and polyester.

The barrier layer 412 blocks oxygen and moisture, prevents diffusion of moisture or impurities through the substrate 411, and provides a flat surface on the substrate 411. A thin film transistor TFT may be formed on the barrier layer 412. In an exemplary embodiment, a top gate type thin film transistor is provided as the thin film transistor TFT. However, other types of thin film transistor, e.g., a bottom gate type thin film transistor, may be provided as the thin film transistor TFT.

A semiconductor active layer 413 may be formed on the barrier layer 412. In the semiconductor active layer 413, a source region 414 and a drain region 415 may be formed by doping N-type or P-type dopant ions. A region between the source region 414 and the drain region 415 may be a channel region 416 that is not doped.

The semiconductor active layer 413 may be formed of polysilicon in which amorphous silicon is crystallized. Also, the semiconductor active layer 413 may be formed of an oxide semiconductor. For example, the oxide semiconductor may include an oxide of a material of Group 4, 12, 13, or 14 metal elements, e.g., zinc (Zn), indium (In), gallium (Ga), tin (Sn), cadmium (Cd), germanium (Ge), and hafnium (Hf), and any combination thereof.

A gate insulating layer 417 may be deposited on the semiconductor active layer 413. The gate insulating layer 417 may include an inorganic material, e.g., a metal oxide, a silicon oxide, or a silicon nitride. The gate insulating layer 417 may have a single layer structure or a multiple layer structure.

A gate electrode 418 may be formed in a predetermined region on the gate insulating layer 417. The gate electrode 418 may include multiple layers or a single layer of, e.g., gold (Au), silver (Ag), copper (Cu), nickel (Ni), platinum (Pt), palladium (Pd), aluminum (Al), molybdenum (Mo), or chromium (Cr), or may include an alloy, e.g., an Al:Nd (neodymium) alloy or an Mo:W (tungsten) alloy.

An interlayer insulating layer 419 may be formed on the gate electrode 418. The interlayer insulating layer 419 may be formed of an insulating material, e.g., a silicon oxide or a silicon nitride. Also, the interlayer insulating layer 419 may be formed of an insulating organic material.

A source electrode 420 and a drain electrode 421 may be formed on the interlayer insulating layer 419. In detail, a contact hole may be formed in the gate insulating layer 417 and the interlayer insulating layer 419 by removing a portion thereof, the source electrode 420 may be electrically connected to the source region 414 through the contact hole, and the drain electrode 421 may be electrically connected to the drain region 415 through the contact hole.

A passivation layer 422 may be formed on the source electrode 420 and the drain electrode 421. The passivation layer 422 may be formed of an organic material or an inorganic material, e.g., a silicon oxide or a silicon nitride.

A planarization layer 423 may be formed on the passivation layer 422. The planarization layer 423 may include an organic material, e.g., acryl, polyimide, or benzocyclobutene (BCB).

An organic light-emitting diode OLED may be formed on the thin film transistor TFT. The organic light-emitting diode OLED may include a first electrode 425, a second electrode 427, and an intermediate layer 426 interposed between the first electrode 425 and the second electrode 427.

The first electrode 425 may be electrically connected to any one of the source electrode 420 and the drain electrode 421 through a contact hole. The first electrode 425 may correspond to a pixel electrode.

The first electrode 425 may function as an anode and may be formed of various conductive materials. The first electrode 425 may be formed as a transparent electrode or a reflective electrode.

For example, when the first electrode 425 is used as a transparent electrode, the first electrode 425 may include, e.g., indium tin oxide (ITO), indium zinc oxide (IZO), zinc oxide (ZnO), or indium oxide ($In_2O_3$). When the first electrode 425 is used as a reflective electrode, the first electrode 425 may be formed by forming a reflective layer of, e.g., silver (Ag), magnesium (Mg), aluminum (Al), platinum (Pt), palladium (Pd), gold (Au), nickel (Ni), neodymium (Nd), iridium (Ir), chromium (Cr), or any combination thereof and forming indium tin oxide (ITO), indium zinc oxide (IZO), zinc oxide (ZnO), or indium oxide ($In_2O_3$) on the reflective layer.

A pixel definition layer (PDL) 424 may be formed on the planarization layer 423 to cover an edge of the first electrode 425 of the organic light-emitting diode OLED. The pixel definition layer 424 may surround the edge of the first electrode 425 to define a light-emitting region of each subpixel.

The pixel definition layer 424 may be formed of an organic material or an inorganic material. For example, the pixel definition layer 424 may be formed of an organic material, e.g., polyimide, polyamide, benzocyclobutene, acryl resin, or phenol resin, or an inorganic material, e.g., $SiN_x$. The pixel definition layer 424 may be formed of a single layer or multiple layers.

The intermediate layer 426 may be formed on the first electrode 425 in a region that is exposed by etching a portion of the pixel definition layer 424. The intermediate layer 426 may be formed by deposition.

The intermediate layer 426 may be formed of a low-molecular organic material or a high-molecular organic material. The intermediate layer 426 may include an organic emission layer (EML). As another example, the intermediate layer 426 may include an organic emission layer and may further include at least one of a hole injection layer (HIL), a hole transport layer (HTL), an electron transport layer (ETL), and an electron injection layer (EIL). However, exemplary embodiments are not limited thereto, and the intermediate layer 426 may include an organic emission layer and may further include various other functional layers.

The second electrode 427 may be formed on the intermediate layer 426. The second electrode 427 may correspond to a common electrode. Like the first electrode 425, the second electrode 427 may be formed as a transparent electrode or a reflective electrode.

When the first electrode 425 is formed as a transparent electrode or a reflective electrode, it may be formed to have a shape corresponding to an opening of each subpixel. On the other hand, the second electrode 427 may be overall deposited as a transparent electrode or a reflective electrode on a display unit. As another example, the second electrode 427 may be formed in a predetermined pattern instead of overall deposition. The first electrode 425 and the second electrode 427 may be stacked at opposite positions.

The first electrode 425 and the second electrode 427 may be insulated from each other by the intermediate layer 426. When a voltage is applied to the first electrode 425 and the second electrode 427, visible light is emitted from the intermediate layer 426 to implement an image that is recognizable by a user.

An encapsulation portion 440 may be formed on the organic light-emitting device OLED. The encapsulation portion 440 may be formed to protect the intermediate layer 426 or other thin films from external moisture or oxygen.

The encapsulation portion 440 may include a stack of one or more organic layers and one or more inorganic layers. For example, the encapsulation portion 440 may include a stack of one or more organic layers 441 and 442, e.g., epoxy, polyimide, polyethylene terephthalate, polycarbonate, polyethylene, and polyacrylate, and one or more inorganic layers 443, 444, and 445, e.g., a silicon oxide ($SiO_2$), a silicon nitride ($SiN_x$), an aluminum oxide ($Al_2O_3$), a titanium oxide ($TiO_2$), a zirconium oxide ($ZrO_x$), and a zinc oxide (ZnO).

The encapsulation portion 440 may include one or more organic layers 441 and 442 and two or more inorganic layers 443, 444, and 445. The top layer 445 of the encapsulation portion 445, which is exposed outside, may be formed of an inorganic layer in order to prevent penetration of moisture into the organic light-emitting device OLED.

By way of summation and review, organic layers and/or electrodes of organic light-emitting display apparatuses are formed by vacuum deposition. However, as the resolution of organic light-emitting display apparatuses increases, the width of an open slit of a mask used in a deposition process and its distribution decreases. Also, in order to manufacture a high-resolution organic light-emitting display apparatus, a shadow effect needs to be reduced or removed. Accordingly, a deposition process is performed while a substrate and a mask adhere closely to each other, and the development of a technology for improving the close adhesion between the substrate and the mask is required.

Therefore, as described above, according to the one or more of the above exemplary embodiments, by using the mask frame assembly having the dummy portion with a gradually increased thickness connecting the deposition pattern portion to a rib portion, the organic light-emitting device may be accurately formed by accurately depositing the deposition material on the substrate in the deposition process. A method of manufacturing the mask frame assembly, and a method of manufacturing the organic light-emitting display apparatus are provided as well.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A mask frame assembly, comprising:
   a frame; and
   a mask tensioned on the frame in a first direction, the mask including:
      a deposition pattern portion having a plurality of pattern holes therethrough, such that a deposition material passing through the pattern holes in a second direction is deposited on a substrate, and
      a dummy portion extending from the deposition pattern portion in the first direction, the dummy portion having an increased thickness in the second direction as a distance from the deposition pattern portion in the first direction increases.

2. The mask frame assembly as claimed in claim 1, wherein the dummy portion includes a plurality of step portions from the deposition pattern portion in the first direction.

3. The mask frame assembly as claimed in claim 2, wherein lengths of the plurality of step portions in the first direction decrease as the distance from the deposition pattern portion in the first direction increases.

4. The mask frame assembly as claimed in claim 2, wherein heights of the plurality of step portions in the second direction decrease as the distance from the deposition pattern portion in the first direction increases.

5. The mask frame assembly as claimed in claim 2, wherein the dummy portion further comprises a slope portion between the deposition pattern portion and the plurality of step portions.

6. The mask frame assembly as claimed in claim 1, wherein the dummy portion includes a plurality of concave curved portions from the deposition pattern portion in the first direction.

7. The mask frame assembly as claimed in claim 6, wherein curvature radii of the plurality of curved portions decrease as the distance from the deposition pattern portion in the first direction increases.

8. The mask frame assembly as claimed in claim 6, wherein the dummy portion further comprises a slope portion between the deposition pattern portion and the plurality of curved portions.

9. The mask frame assembly as claimed in claim 1, wherein the dummy portion includes a dummy pattern at one surface of the mask, the dummy pattern having a shape of a hole, a slit, or a groove.

10. A method of manufacturing a mask frame assembly, the method comprising:
    preparing a frame;
    preparing a mask, the mask including:
       a deposition pattern portion having a plurality of pattern holes therethrough, such that a deposition material passing through the pattern holes in a second direction is deposited on a substrate, and
       a dummy portion extending from the deposition pattern portion in the first direction, the dummy portion having an increased thickness in the second direction as a distance from the deposition pattern portion in the first direction increases; and
    installing the mask on the frame while tensioning both ends of the mask in the first direction.

11. The method as claimed in claim 10, wherein preparing the mask includes irradiating a laser onto the dummy portion to form a plurality of step portions in the first direction.

12. The method as claimed in claim 11, wherein forming the plurality of step portions in the mask includes decreasing lengths of the plurality of step portions in the first direction as a distance from the deposition pattern portion in the first direction increases.

13. The method as claimed in claim 11, wherein forming the plurality of step portions in the mask includes decreasing heights of the plurality of step portions as a distance from the deposition pattern portion in the first direction increases.

14. The method as claimed in claim 10, wherein preparing the mask includes forming a plurality of curved portions at the dummy portion in the first direction by an etching process.

15. The method as claimed in claim 14, wherein forming the plurality of curved portions includes decreasing radii of the curved portions in the first direction as a distance from the deposition pattern portion in the first direction increases.

16. The method as claimed in claim 10, wherein preparing the mask includes forming a dummy pattern at one surface of the dummy portion, the dummy pattern having a shape of a hole, a slit, or a groove.

17. A method of manufacturing an organic light-emitting display apparatus, the method comprising:
    forming a first electrode and a second electrode that are opposite to each other on a substrate;
    forming an organic layer between the first electrode and the second electrode,
    wherein the organic layer or the second electrode is deposited by using a mask frame assembly including:
       a frame, and
       a mask tensioned on the frame in a first direction, the mask including:
          a deposition pattern portion having a plurality of pattern holes therethrough, such that a deposition material passing through the pattern holes in a second direction is deposited on a substrate, and
          a dummy portion extending from the deposition pattern portion in the first direction, the dummy portion having an increased thickness in the second direction as a distance from the deposition pattern portion in the first direction increases.

* * * * *